(12) United States Patent
Kim

(10) Patent No.: US 12,301,042 B2
(45) Date of Patent: May 13, 2025

(54) ERROR DETECTING METHOD OF CHARGING SWITCH UNIT AND BATTERY SYSTEM USING THE SAME

(71) Applicant: LG Energy Solution, Ltd., Seoul (KR)

(72) Inventor: Jisu Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 733 days.

(21) Appl. No.: 17/623,321

(22) PCT Filed: Aug. 12, 2020

(86) PCT No.: PCT/KR2020/010642
§ 371 (c)(1),
(2) Date: Dec. 28, 2021

(87) PCT Pub. No.: WO2021/085816
PCT Pub. Date: May 6, 2021

(65) Prior Publication Data
US 2022/0368148 A1 Nov. 17, 2022

(30) Foreign Application Priority Data
Oct. 29, 2019 (KR) .......................... 10-2019-0135678

(51) Int. Cl.
*H02J 7/00* (2006.01)
*G01R 19/165* (2006.01)
(Continued)

(52) U.S. Cl.
CPC .... *H02J 7/00712* (2020.01); *G01R 19/16576* (2013.01); *G01R 31/3835* (2019.01); *H02H 7/222* (2013.01)

(58) Field of Classification Search
CPC .................................................. H02J 7/00712
(Continued)

(56) References Cited

U.S. PATENT DOCUMENTS

2005/0017676 A1 1/2005 Takimoto et al.
2006/0139006 A1 6/2006 Wang et al.
(Continued)

FOREIGN PATENT DOCUMENTS

CN 103296715 A 9/2013
CN 103312017 A 9/2013
(Continued)

OTHER PUBLICATIONS

International Search Report for PCT/KR2020/010642 dated Dec. 1, 2020. 2 pgs.
(Continued)

*Primary Examiner* — Jerry D Robbins
(74) *Attorney, Agent, or Firm* — Lerner David LLP

(57) ABSTRACT

An error detecting method of a charging switch unit including a first charging switch and a second charging switch connected to a charging line of a battery, including: first switching one of the first charging switch and the second charging switch according to a switch control command; determining whether voltages at opposite ends of the second charging switch are similar when the switch control command indicates open and the first charging switch is opened first; determining that the first charging switch is normal when the voltages at the opposite ends of the second charging switch are similar; determining whether the voltages at the opposite ends of the first charging switch are similar when the switch control command indicates closed and the first charging switch is closed first; and determining that the first charging switch is normal when the voltages at the opposite ends of the first charging switch are similar.

16 Claims, 6 Drawing Sheets

(51) Int. Cl.
G01R 31/3835 (2019.01)
H02H 7/22 (2006.01)

(58) Field of Classification Search
USPC .......................................................... 320/109
See application file for complete search history.

(56) References Cited

U.S. PATENT DOCUMENTS

| | | | |
|---|---|---|---|
| 2008/0079416 A1 | 4/2008 | Kawamura | |
| 2011/0305926 A1* | 12/2011 | Kim | H02J 7/0031 |
| | | | 429/50 |
| 2012/0038285 A1 | 2/2012 | Leung et al. | |
| 2012/0038615 A1 | 2/2012 | Leung et al. | |
| 2013/0181681 A1* | 7/2013 | Mukai | H02J 7/0013 |
| | | | 320/128 |
| 2013/0229186 A1 | 9/2013 | Shiraishi et al. | |
| 2013/0234504 A1 | 9/2013 | Morita | |
| 2013/0257062 A1 | 10/2013 | Sakakibara | |
| 2013/0320986 A1 | 12/2013 | Shiraishi et al. | |
| 2014/0176140 A9 | 6/2014 | Shiraishi et al. | |
| 2014/0339984 A1 | 11/2014 | Leung et al. | |
| 2015/0156831 A1 | 6/2015 | Leung et al. | |
| 2015/0316617 A1 | 11/2015 | Shiraishi et al. | |
| 2016/0084908 A1 | 3/2016 | Shiraishi et al. | |
| 2016/0282415 A1 | 9/2016 | Shiraishi et al. | |
| 2017/0040809 A1 | 2/2017 | Shiraishi et al. | |
| 2018/0024196 A1 | 1/2018 | Imura et al. | |
| 2019/0101593 A1 | 4/2019 | Grazioli et al. | |
| 2021/0376623 A1* | 12/2021 | Zhang | H02J 7/0047 |

FOREIGN PATENT DOCUMENTS

| | | |
|---|---|---|
| CN | 103359014 A | 10/2013 |
| CN | 107112744 A | 8/2017 |
| JP | 2007145208 A | 6/2007 |
| JP | 2009-259762 A | 11/2009 |
| JP | 2010140785 A | 6/2010 |
| JP | 2013181822 A | 9/2013 |
| JP | 2015008600 A | 1/2015 |
| JP | 2016192897 A | 11/2016 |
| JP | 2018-064321 A | 4/2018 |
| JP | 2018143044 A | 9/2018 |
| JP | 2019066476 A | 4/2019 |
| KR | 20130042015 A | 4/2013 |
| KR | 20140020765 A | 2/2014 |
| KR | 2015-0050227 A | 5/2015 |

OTHER PUBLICATIONS

Extended European Search Report including Written Opinion for Application No. 20882287.4 dated Jun. 27, 2022, pp. 1-8.

* cited by examiner

FIG. 3

| First charging switch | Second charging switch | VN1 | VN2 | VN3 |
|---|---|---|---|---|
| Open | Closed | $= VS$ | $\doteq VN3$ | $\doteq VN2$ |
| Closed | Open | $\doteq VN3$ | $\doteq VB$ | $\doteq VN1$ |
| Closed | Closed | $\doteq VN2 \doteq VN3$ | $\doteq VN2 \doteq VN3$ | $\doteq VN2 \doteq VN3$ |
| Open | Open | $\doteq VN2 \doteq VN3$ | $\doteq VN2 \doteq VN3$ | $\doteq VN2 \doteq VN3$ |

ERROR DETECTING METHOD OF CHARGING SWITCH UNIT AND BATTERY SYSTEM USING THE SAME

CROSS-REFERENCE TO RELATED APPLICATION

The present application is a national phase entry under 35 U.S.C. § 371 of International Application No. PCT/KR2020/010642 filed Aug. 12, 2020, published in Korean, which claims priority from Korean Patent Application No. 10-2019-0135678, filed in the Korean Intellectual Property Office on Oct. 29, 2019, all of which are incorporated herein by reference.

TECHNICAL FIELD

The present disclosure relates to an error detecting method of a charging switch unit and a battery system to which the same is applied.

BACKGROUND ART

A conventional mechanical relay is connected between a battery for an electric vehicle and an external device, to control electrical connection between the battery and the external device. However, since the mechanical relay has a large volume and high power consumption, a technique for replacing the mechanical relay with an electronic switch has been studied.

In the case of a low-voltage battery, since a load applied to an electronic switch is small, the electronic switch may be easily applied instead of a mechanical relay. For example, a plurality of switches are connected in series and in parallel and used in consideration of limits of an allowable current and voltage that can flow through a switch element and ease of controlling heat of the switch element. In this case, there is a problem in that it is impossible to determine whether each of the switches connected in series and parallel has a failure.

A voltage or current sensor must be provided at opposite ends of each switch to determine whether a failure occurs in an on or off state for each switch, which causes problems such as an increase in cost, an increase in circuit complexity, and an increase in printed circuit board (PCB) area.

The above information disclosed in this Background section is only for enhancement of understanding of the background of the invention, and therefore it may contain information that does not form the prior art that is already known in this country to a person of ordinary skill in the art.

SUMMARY

Technical Problem

The present disclosure has been made in an effort to provide an error detecting method of a charging switch unit and a battery system to which the same is applied.

Technical Solution

An embodiment of the present invention provides an error detecting method of a charging switch unit including a first charging switch and a second charging switch connected to a charging line of a battery, including: switching the first charging switch according to a switch control command; in response to the first charging switch being switched to open: determining whether voltages at opposite ends of the second charging switch are within a predetermined range; and determining that the first charging switch is normal in response to the voltages at the opposite ends of the second charging switch being within the predetermined range; in response to the first charging switch being switched to closed: determining whether the voltages at the opposite ends of the first charging switch are within the predetermined range; and determining that the first charging switch is normal in response to the voltages at the opposite ends of the first charging switch being within the predetermined range.

The error detecting method of the charging switch unit may further include opening the second charging switch in response to the first charging switch being switched to open and the voltages at the opposite ends of the second charging switches being within the predetermined range.

The error detecting method of the charging switch unit may further include closing the second charging switch in response to the first charging switch being switched to closed, and the voltages at the opposite ends of the first charging switch being within the predetermined range.

The error detecting method of the charging switch unit may further include: switching the second charging according to the switch control command; and in response to the second charging switch being switched to open determining whether the voltages at the opposite ends of the first charging switch are within the predetermined range; and determining that the second charging switch is normal in response to the voltages at the opposite ends of the first charging switch being within the predetermined range.

The error detecting method of the charging switch unit may further include opening the first charging switch in response to the second charging switch being switched to open, and the voltages at the opposite ends of the first charging switch being within the predetermined range.

The error detecting method of the charging switch unit may further include: switching the second charging according to the switch control command; and in response to the second charging switch being switched to open determining whether the voltages at the opposite ends of the second charging switch are within the predetermined range; and determining that the second charging switch is normal in response to the voltages at the opposite ends of the second charging switch being within the predetermined range.

The error detecting method of the charging switch unit may further include closing the first charging switch in response to the second charging switch being switched to closed, and the voltages at the opposite ends of the second charging switch being within the predetermined range.

The error detecting method of the charging switch unit may further include determining which of the first charging switch and the second charging switch to switch according to the switch control command based on the switch control command.

Another embodiment of the present invention provides a battery system including: a first charging switch having opposite ends connected to a first terminal of the battery system and an intermediate location of the battery system, respectively; a second charging switch having opposite ends connected to the intermediate location and a second terminal of the battery system, respectively; and a battery management system configured to: in response to a switch control command indicating to open the first charging switch before the second charging switch, determine whether the first charging switch is normal based on a voltage of an intermediate location and a voltage of the second terminal being within a predetermined range; and in response to the switch control command indicating to close the first charging switch before the second charging switch, determine whether the first switch is normal based on a voltage of the first terminal and the voltage of the intermediate location being within the predetermined range.

The battery management system may include a main control circuit configured to generate a first charging control signal that controls a switching operation of the first charging switch, and generate a second charging control signal that switches the second charging switch in response to the first charging switch being normal.

The main control circuit may be configured to generate the first charging control signal at a disable level in response to the switch control command indicating to open the first charging switch and generate the second charging control signal at the disable level in response to the voltage of the intermediate location and the voltage of the second terminal being within the predetermined range.

The main control circuit may be configured to generate the first charging control signal at an enable level in response to the switch control command indicating to close the first charging switch and generate the second charging control signal at the enable level in response to the voltage of the intermediate location and the voltage of the first terminal being within the predetermined range.

The battery management system may be configured to in response to a switch control command indicating to open the second charging switch before the first charging switch, determine whether the second charging switch is normal based on the voltage of the intermediate location and a voltage of the first terminal being within the predetermined range; and in response to the switch control command indicating to close the second charging switch before the first charging switch, determine whether the second switch is normal based on the voltage of the second terminal and the voltage of the intermediate location being within the predetermined range.

The battery management system may include a main control circuit configured to generate a second charging control signal that controls a switching operation of the second charging switch, and to generate a first charging control signal that switches the first charging switch in response to the second charging switch being normal.

The main control circuit may be configured to generate the second charging control signal at a disable level in response to the switch control command indicating to open the second charging switch, and generate the first charging control signal at the disable level in response to the voltage of the intermediate location and the voltage of the first terminal being within the predetermined range.

The main control circuit may be configured to generate the second charging control signal at an enable level in response to the switch control command indicating to close the first charging switch, and generate the first charging control signal at the enable level in response to the voltage of the intermediate location and the voltage of the second terminal being within the predetermined range.

Advantageous Effects

The present disclosure provides a method for detecting an error in a charging switch unit without an increase in cost, an increase in circuit complexity, and an increase in PCB area, and a battery system to which the same is applied.

BRIEF DESCRIPTION OF THE DRAWINGS

FIG. 3 illustrates voltages of an input terminal, an intermediate terminal, and an output terminal of a charging switch unit depending on states of a first charging switch and a second charging switch in a normal state.

MODE FOR INVENTION

Figure 1:
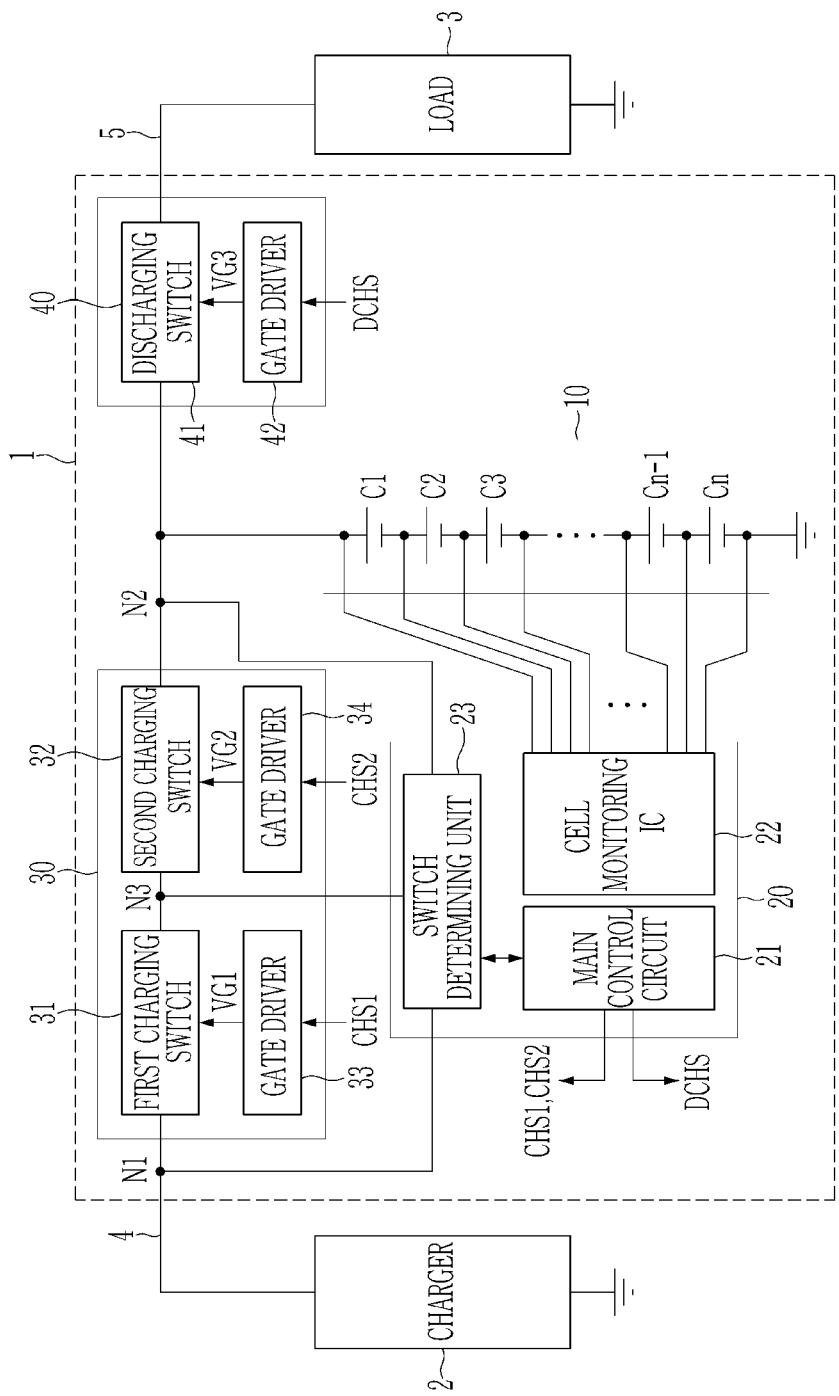
FIG. 1 illustrates a battery system according to an embodiment.

Hereinafter, embodiments disclosed in the present specification will be described in detail with reference to the accompanying drawings. In the present specification, the same or similar components will be denoted by the same or similar reference numerals, and a repeated description thereof will be omitted. Terms "module" and/or "unit" for components used in the following description are used only in order to easily describe the specification. Therefore, these terms do not have meanings or roles that distinguish them from each other in and of themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to the other component or be connected or coupled to the other component with a further component intervening therebetween. On the other hand, it is to be understood that when one component is referred to as being "connected or coupled directly" to another component, it may be connected to or coupled to the other component without another component intervening therebetween.

It will be further understood that terms "comprises/includes" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 illustrates a battery system according to an embodiment.

In FIG. 1, the battery system 1 is connected to a charger 2 through a charging line 4 and to a load 3 through a discharging line 5.

The battery system 1 includes a battery module 10, a battery management system (BMS) 20, a charging switch unit 30, and a discharging switch unit 40.

In FIG. 1, the battery module 10 is illustrated as having n battery cells C1 to Cn connected in series, but the present invention is not limited thereto. A number of battery cells constituting the battery module 10 may be set to an appropriate number for supplying power to a load. In addition, the battery module 10 may be configured by serially connecting battery packs in which a plurality of battery cells are connected in series, or by connecting battery packs in parallel. That is, the number and connection relationship of each of the battery packs and battery cells constituting the battery module may be appropriately designed to supply necessary power.

The BMS 20 senses battery cell information for each of the battery cells C1 to Cn, manages an operation of the battery module 10 based on the sensed battery cell information, and controls switching of the charging switch unit 30 and the discharging switch unit 40. In addition, the BMS 20 may diagnose the charging switch unit 30 to determine whether there is an error.

The BMS 20 includes a cell monitoring IC 22, a main control circuit 21, and a switch diagnosis unit 23.

The cell monitoring IC 22 may be electrically connected to the battery cells C1 to Cn to sense battery cell information for each of the battery cells C1 to Cn, and may transfer the sensed battery cell information to the main control circuit 21. The battery cell information may include a voltage, a temperature, and the like of a battery cell.

The main control circuit 21 receives a signal regarding battery cell information of each of the battery cells from the cell monitoring IC 22 and signals instructing charging and discharging from an electronic control circuit of a vehicle to which the battery system 1 is applied, to manages the battery module 10 and control the switching of the charging switch unit 30 and the discharging switch unit 40 based on the received signals. Management of the battery module 10 includes an overvoltage and overcurrent protection operation for the battery module 10, a cell balancing operation for the battery cells C1 to Cn, charging and discharging of the battery module 10, and the like.

The main control circuit 21 may measure a voltage of the battery module 10 during charging or a voltage of the battery module 10 during discharging through the charging line 4 or the discharging line 5. In addition, information related to a sensed current may be received from a current sensor (not illustrated) that senses a current flowing through the battery module 10.

The main control circuit 21 may generate battery cell information, a state of charge (SOC), a health state, etc. of each of the battery cells, and may construct the generated information as battery state signals to transmit them to an electronic control circuit of a vehicle through CAN communication.

The switch diagnosis unit 23 may measure a voltage of each of an input terminal N1, an intermediate terminal N3, and an output terminal N2 of the charging switch unit 30, and may diagnose the charging switch unit 30 based on a measurement result thereof to determine whether there is an error. The input terminal N1 is a node to which the charger 2 and the charging switch unit 30 are connected, the intermediate terminal N3 is a node to which a first charging switch 31 and a second charging switch 32 are connected, and the output terminal N2 is a node to which the charging switch unit 30 and the battery module 10 are connected. The switch diagnosis unit 23, the charging switch unit 30, and the discharging switch unit 40 will be described later with reference to FIG. 2 together with FIG. 1.

The load 3 may be an electric load of the vehicle to which the battery system 1 is applied. The content shown in FIG. 1 is an example for describing the present invention, and the present invention is not limited thereto. When the discharging switch unit 40 is turned on, the battery module 10 and the load 3 are connected, and power is supplied from the battery module 10 to the load 3.

The charger 2 may be implemented as a DC-DC converter, and converts input power to generate output power of a voltage that is suitable for charging the battery module 10. When the charging switch unit 30 is turned on, the charger 2 may be connected to the battery module 10 through the charging line 4, and power may be supplied to the battery module 10 from the charger 2.

The charging switch unit 30 may be electrically connected to each of the charger 2 and the battery module 10 through the charging line 4. The charging switch unit 30 includes a first charging switch 31, a second charging switch 32, and two gate drivers 33 and 34. The gate driver 33 and the gate driver 34 respectively generate gate voltages VG1 and VG2 that control switching of the first charging switch 31 and the second charging switch 32 depending on a first charging control signal CHS1 and a second charging control signal CHS2 transmitted from the BMS 20.

The discharging switch unit 40 is electrically connected to each of the battery module 10 and the load 3 through a discharging line 5. The discharging switch unit 40 includes a discharging switch 41 and a gate driver 42. The gate driver 42 generates a gate voltage VG3 that controls switching of the discharging switch 41 depending on a discharging control signal DCHS transmitted from the BMS 20.

Figure 2:
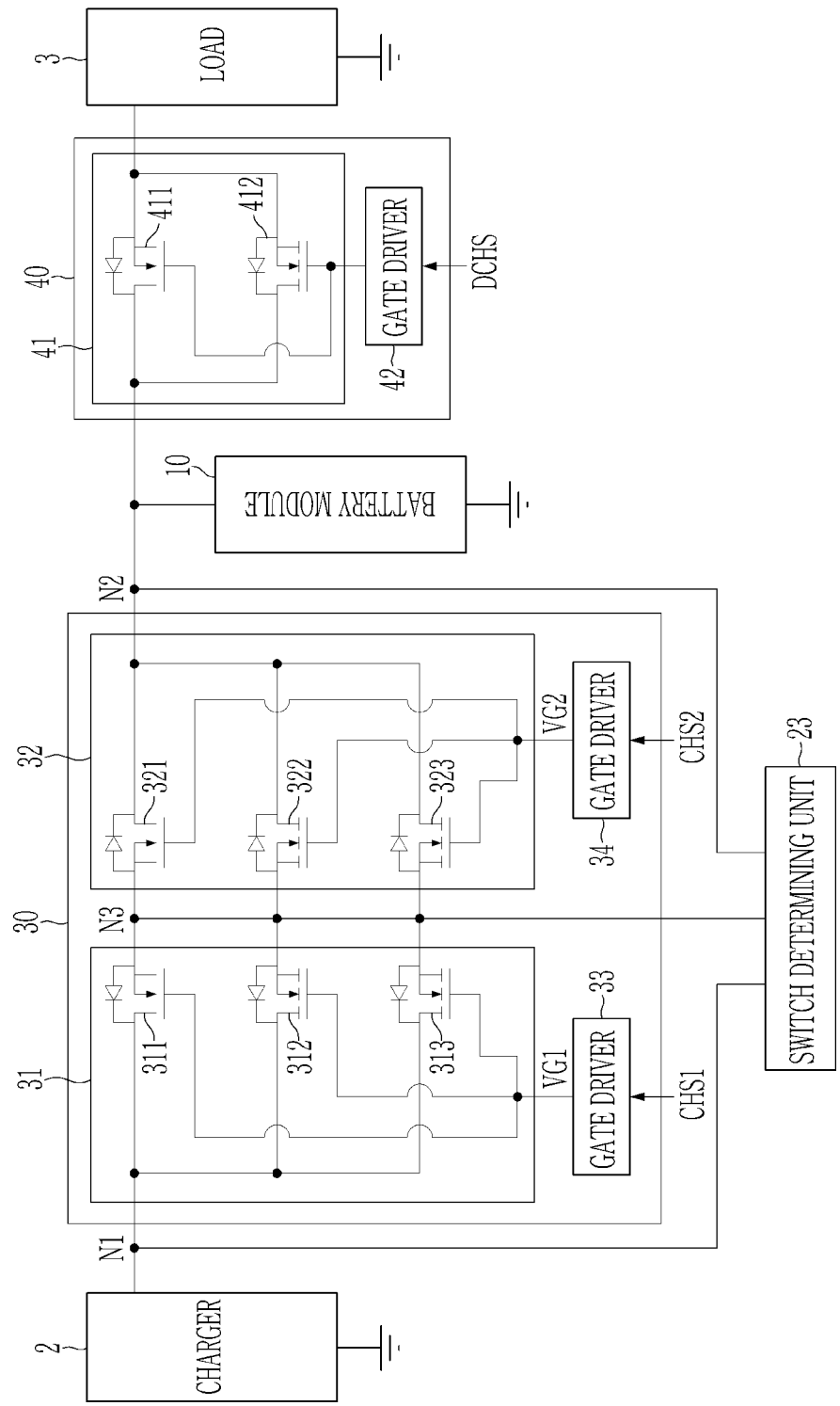
FIG. 2 illustrates a circuit diagram specifically showing a charging switch unit and a discharging switch unit according to an embodiment.

FIG. 2 illustrates a circuit diagram specifically showing a charging switch unit and a discharging switch unit according to an embodiment.

As illustrated in FIG. 2, the charging switch unit 30 includes a first charging switch 31 and a second charging switch 32 connected in series and gate drivers 33 and 34, the first charging switch 31 includes three switches 311 to 313 connected in parallel, and the second charging switch 32 includes three switches 321 to 323 connected in parallel. A number of switches constituting the first charging switch 31 and the second charging switch 32 may be determined depending on a magnitude of the current flowing in the charging line 4, and three switches are illustrated in FIG. 2 as an example for describing an embodiment, and the present invention is not limited thereto.

In addition, although the switches 311 to 313 and 321 to 323 are illustrated as n-channel MOSFETs in FIG. 2, a channel type of the transistor and a type of the transistor are not limited thereto. Hereinafter, in the description of FIG. 2, each of opposite ends of the MOSFET is divided into a first end or a second end instead of a source and a drain.

The three switches 311 to 313 are connected between the input terminal N1 and the intermediate terminal N3, a first end of each of the three switches 311 to 313 is connected to the input terminal N1, and a second end is connected to the intermediate terminal N3. A gate voltage VG1 outputted from the gate driver 33 is applied to gates of the three switches 311 to 313.

The three switches 321 to 323 are connected between the output N2 and the intermediate terminal N3, a first end of each of the three switches 321 to 323 is connected to the output N2, and a second end is connected to the intermediate terminal N3. A gate voltage VG2 outputted from the gate driver 34 is applied to gates of the three switches 321 to 323.

The gate driver 33 generates the gate voltage VG1 depending on the first charging control signal CHS1 transmitted from the main control circuit 21. For example, the gate driver 33 may generate the gate voltage VG1 of an on level depending on the first charging control signal CHS1 of a level (enable level) instructing turn-on of the first charging switch 31. The gate driver 33 may generate the gate voltage VG1 of an off level depending on the first charging control signal CHS1 of a level (disable level) instructing turn-off of the first charging switch 31. Since the three switches 311 to 313 constituting the first charging switch 31 are of an n-channel type, the on level may be a high level and the off level may be a low level.

The gate driver 34 generates the gate voltage VG2 depending on the second charging control signal CHS2 transmitted from the main control circuit 21. For example, the gate driver 34 may generate the gate voltage VG2 of an on level depending on the second charging control signal CHS2 of a level (enable level) instructing turn-on of the second charging switch 32. The gate driver 34 may generate the gate voltage VG2 of an off level depending on the second charging control signal CHS2 of a level (disable level) instructing turn-off of the second charging switch 32. Since the three switches 321 to 323 constituting the second charging switch 32 are of an n-channel type, the on level may be a high level and the off level may be a low level.

For charging, when the charging switch unit 30 is turned on, the first charging control signal CHS1 and the second charging control signal CHS2 may be synchronized to the enable level at a same time point. During diagnosis for detecting an error in the charging switch unit 30, a time difference may exist between time points at which the first charging control signal CHS1 and the second charging control signal CHS2 are respectively enabled. This will be described with reference to FIG. 3 to FIG. 5.

As illustrated in FIG. 2, the discharging switch unit 40 includes a discharging switch 41 and a gate driver 42, and the discharging switch 41 includes two discharging switches 411 and 412 connected in parallel. A number of switches constituting the discharging switch 41 may be determined depending on a magnitude of the current flowing in the discharging line 5, and two switches are illustrated in FIG. 2 as an example for describing an embodiment, and the present invention is not limited thereto.

In addition, although the switches 411 and 412 are illustrated as n-channel MOSFETs in FIG. 2, a channel type of the transistor and a type of the transistor are not limited thereto.

The two switches 411 and 412 are connected between the output N2 and the load 3, a first end of each of the two switches 411 and 412 is connected to the output N2, and a second end is connected to the load N3. A gate voltage VG3 outputted from the gate driver 42 is applied to gates of the two switches 411 and 412.

The gate driver 42 generates the gate voltage VG3 depending on the discharging control signal DCHS transmitted from the main control circuit 21. For example, the gate driver 42 may generate the gate voltage VG3 of an on level depending on the discharging control signal DCHS of a level (enable level) instructing turn-on of the discharging switch 41. The gate driver 42 may generate the gate voltage VG3 of an off level depending on the discharging control signal DCHS of a level (disable level) instructing turn-off of the discharging switch 41. Since the two switches 411 and 412 constituting the discharging switch 41 are of an n-channel type, the on level may be a high level and the off level may be a low level.

FIG. 3 illustrates voltages of an input terminal, an intermediate terminal, and an output terminal of a charging switch unit depending on states of a first charging switch and a second charging switch in a normal state.

As illustrated in FIG. 3, when the first charging switch 31 is opened and the second charging switch 32 is closed, a voltage VN1 of the input terminal N1 is a voltage VS of a power supplied from the charger 2, and a voltage VN3 and a voltage VN2 of the intermediate terminal N3 and the output terminal N2 are similar. It is said to be similar when a difference between the two voltages VN3 and VN2 is within a predetermined range, and the predetermined range may be a voltage obtained by adding a predetermined margin to a voltage at opposite ends when the second charging switch 32 is closed.

When the first charging switch 31 is closed and the second charging switch 32 is opened, the voltage VN2 of the output terminal N2 is the voltage VB of the battery module 10 and is the voltage of the power supplied from the charger 2, and the voltage VN3 of the intermediate terminal N3 and the voltage VN1 of the input terminal N1 are similar. It is said to be similar when a difference between the two voltages VN3 and VN1 is within a predetermined range, and the predetermined range may be a voltage obtained by adding a predetermined margin to a voltage at opposite ends when the first charging switch 31 is closed.

When the first charging switch is closed and the second charging switch is closed, the voltage VN1, the voltage VN2, and the voltage VN3 of the input terminal N1, the intermediate terminal N3, and the output terminal N2 are all within a predetermined range and are similar to each other.

Even when the first charging switch 31 is opened and the second charging switch 32 is opened, the voltage VN1, the voltage VN2, and the voltage VN3 of the input terminal N1, the intermediate terminal N3, and the output terminal N2 are within a predetermined range and are similar to each other.

The switch diagnosis unit 23 according to an embodiment may sense an error in the charging switch unit 30 by using relationships between the voltages VN1, VN3, and VN2 of the input terminal N1, the intermediate terminal N3, and the output terminal N2 illustrated in FIG. 3.

Figure 4:
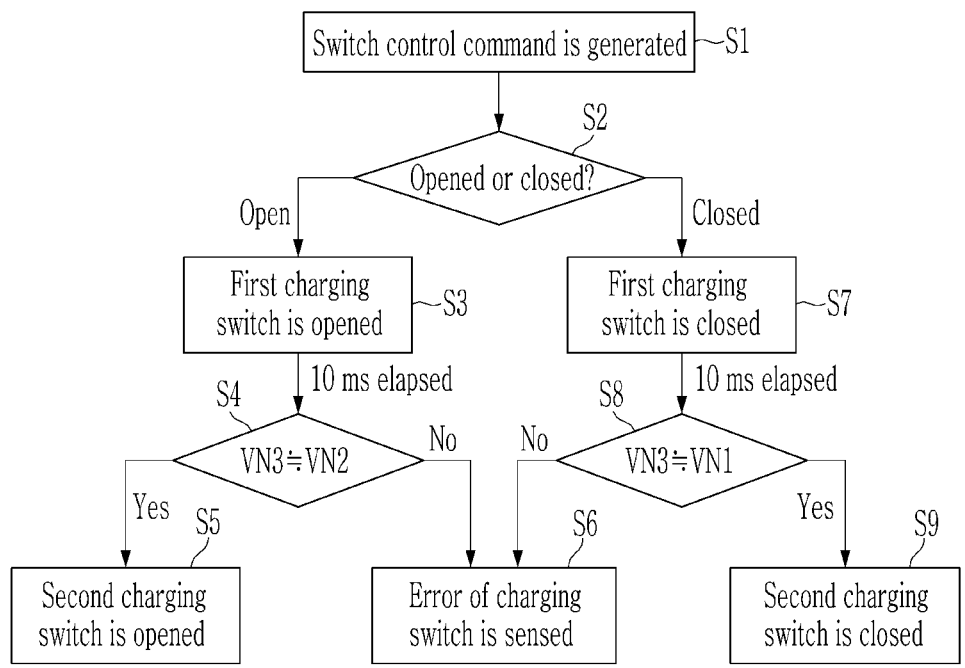
FIG. 4 illustrates a flowchart showing a diagnosis method for detecting an error in a charging switch unit according to an embodiment.

FIG. 4 illustrates a flowchart showing a diagnosis method for detecting an error in a charging switch unit according to an embodiment.

The diagnostic method illustrated in FIG. 4 may be performed whenever a switching operation occurs.

First, a switch control command for instructing a switching operation of the charging switch unit 30 is generated (S1). The BMS 20 may receive a switch control command from an electronic control circuit of an external device to which the battery system 1 is applied. Alternatively, the BMS 20 may generate a switch control command for battery management. Specifically, a configuration for receiving or generating a switch control command may be the main control circuit 21.

The main control circuit 21 determines whether the switch control command is opened or closed (S2). When the switch control command indicates open, it is a command to cut off the connection between the charger 2 and the battery module 10, and the charging switch unit 30 is turned off. When the switch control command indicates closed, it is a command for connecting the charger 2 and the battery module 10, and the charging switch unit 30 is turned on.

As a result of the determination of step S2, when the switch control command indicates open, the main control circuit 21 generates the first charging control signal CHS1 at a disable level to transmit it to the gate driver 33, and the gate driver 33 turns off the switches 311 to 313 by generating the gate voltage VG1 of an off level. Then, the first charging switch 31 is opened (S3).

When a predetermined time (e.g., 10 ms) has elapsed after step S3, the switch diagnosis unit 23 compares the voltage VN3 of the intermediate terminal N3 with the voltage VN2 of the output terminal N2 to determine whether the two voltages are similar (S4). When a difference between the voltage VN3 and the voltage VN2 is smaller than a predetermined threshold voltage, it may be determined that the two voltages are similar, and the threshold voltage may be set by adding a predetermined margin to a voltage at opposite ends in an on state of the second charging switch 32.

When it is determined in step S4 that the voltage VN2 and the voltage VN3 are similar, the switch diagnosis unit 23 diagnoses the first charging switch 31 as a normal state. Subsequently, the main control circuit 21 controls the second charging switch 32 to open the second charging switch 32 (S5). Specifically, the switch diagnosis unit 23 transmits the determination result, that is, the determination result that the voltage VN2 and the voltage VN3 are similar to the main control circuit 21, the main control circuit 21 generates the second charging control signal CHS2 at a disable level and transmits it to the gate driver 34, and the gate driver 34 turns off the switches 321 to 323 by generating the gate voltage VG2 of an off level. Then, the second charging switch 32 is opened.

When it is determined in step S4 that the voltage VN2 and the voltage VN3 are not similar, the switch diagnosis unit 23 diagnoses the first charging switch 31 as an abnormal state, and depending on a diagnosis result thereof, the main control circuit 21 senses an error of the charging switch unit 30 (S6). When an error occurs in the first charging switch 31, it is not normally opened, and thus the voltage VN3 may be affected by the voltage VN1 of the input terminal N1, so that the voltage VN3 and the voltage VN2 may not be similar. Upon sensing an error, the main control circuit 21 may initiate a protection operation to prevent damage to the battery system 1. In a following description, the protection operation may include an operation of notifying a user of an error, an operation of controlling the charging switch to an open state until the charging switch is restored to a normal state, and the like.

As a result of the determination of step S2, when the switch control command indicates closed, the main control circuit 21 generates the first charging control signal CHS1 at an enable level to transmit it to the gate driver 33, and the gate driver 33 turns on the switches 311 to 313 by generating the gate voltage VG1 of an on level. Then, the first charging switch 31 is closed (S7).

When a predetermined time (e.g., 10 ms) has elapsed after step S7, the switch diagnosis unit 23 compares the voltage VN3 of the intermediate terminal N3 with the voltage VN1 of the input terminal N1 to determine whether the two voltages are similar (S8). When a difference between the voltage VN3 and the voltage VN1 is smaller than a predetermined threshold voltage, it may be determined that the two voltages are similar, and the threshold voltage may be set by adding a predetermined margin to a voltage at opposite ends in an on state of the first charging switch 31.

When it is determined in step S8 that the voltage VN1 and the voltage VN3 are similar, the switch diagnosis unit 23 diagnoses the first charging switch 31 as a normal state. Subsequently, the main control circuit 21 controls the second charging switch 32 to close the second charging switch 32 (S9). Specifically, the switch diagnosis unit 23 transmits the determination result, that is, the determination result that the voltage VN1 and the voltage VN3 are similar to the main control circuit 21, the main control circuit 21 generates the second charging control signal CHS2 at an enable level and transmits it to the gate driver 34, and the gate driver 34 turns on the switches 321 to 323 by generating the gate voltage VG2 of an on level. Then, the second charging switch 32 is closed.

When it is determined in step S8 that the voltage VN1 and the voltage VN3 are not similar, the switch diagnosis unit 23 diagnoses the first charging switch 31 as an abnormal state, and depending on a diagnosis result thereof, the main control circuit 21 senses an error of the charging switch unit 30 (S6). When an error occurs in the first charging switch 31, the voltage VN3 and the voltage VN1 may not be similar to each other because the first charging switch 31 is not normally closed. Upon sensing an error, the main control circuit 21 may initiate a protection operation to prevent damage to the battery system 1.

In FIG. 4, it is illustrated that the first charging switch 31 in a configuration of the charging switch unit 30 is controlled before the second charging switch 32 depending on a switch control command, but the invention is not limited thereto.

The first charging switch 31 and the second charging switch 32 may be first alternately controlled depending on the switch control command.

Figure 5:
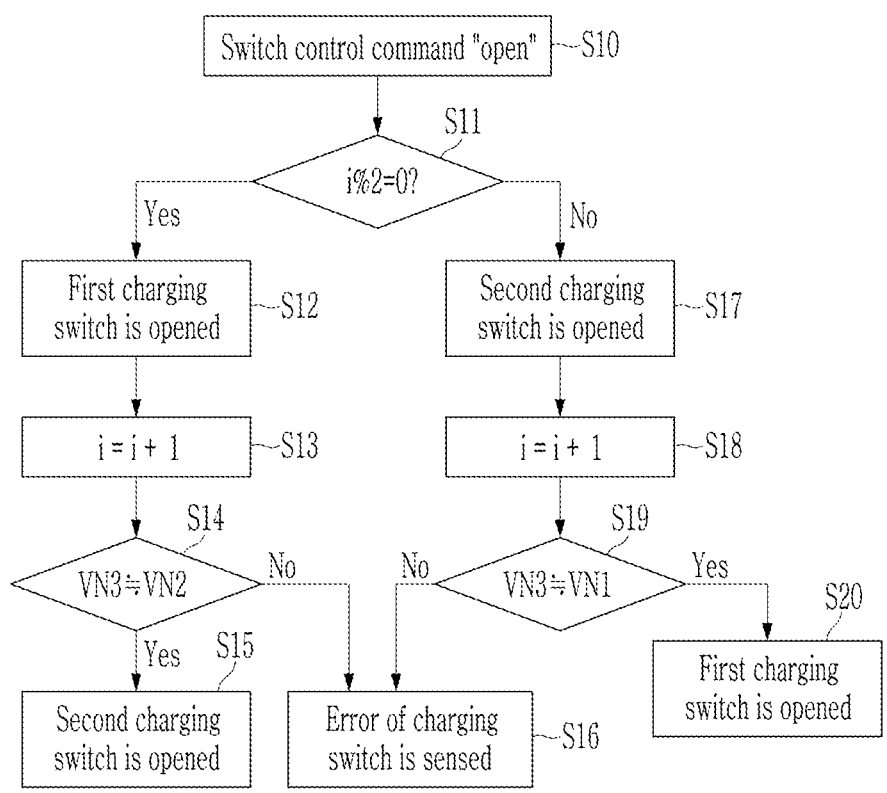
FIG. 5 illustrates a flowchart showing a diagnosis method for sensing an error in a charging switch unit when a switch control command is to open according to an embodiment.

FIG. 5 illustrates a flowchart showing a diagnosis method for sensing an error in a charging switch unit when a switch control command is to open according to an embodiment.

First, a switch control command indicating "open" is generated (S10).

The main control circuit 21 determines whether the remainder obtained by dividing a variable i by 2 is 0 (S11). The variable i is a variable that is set to first alternately control the first charging switch 31 and the second charging switch 32. It is assumed that an initial value is 1.

Since the determination result of step S11 is not 0, the second charging switch 32 is opened under the control of the main control circuit 21 (S17). Specifically, the main control circuit 21 generates the second charging control signal CHS2 at a disable level to transmit it to the gate driver 34, and the gate driver 34 turns off the switches 321 to 323 by generating the gate voltage VG2 of an off level. Then, the second charging switch 32 is opened.

Then, the variable i is increased by 1 (S18). For example, i becomes 2.

When a predetermined time elapses after the second charging switch 32 is opened, the switch diagnosis unit 23 determines whether the voltage VN3 and the voltage VN1 are similar (S19).

When it is determined in step S19 that the voltage VN1 and the voltage VN3 are similar, the switch diagnosis unit 23 diagnoses the second charging switch 32 as a normal state. Subsequently, the main control circuit 21 controls the first charging switch 31 to open the first charging switch 31 (S20). Specifically, the switch diagnosis unit 23 transmits the determination result, that is, the determination result that the voltage VN1 and the voltage VN3 are similar to the main control circuit 21, the main control circuit 21 generates the first charging control signal CHS1 at a disable level and transmits it to the gate driver 33, and the gate driver 33 turns off the switches 311 to 313 by generating the gate voltage VG1 of an off level. Then, the first charging switch 31 is opened.

When it is determined in step S19 that the voltage VN1 and the voltage VN3 are not similar, the switch diagnosis unit 23 diagnoses the second charging switch 32 as an abnormal state, and depending on a diagnosis result thereof, the main control circuit 21 senses an error of the charging switch unit 30 (S16). When an error occurs in the second charging switch 32, it is not normally opened, and thus the voltage VN3 may be affected by the voltage VN2 of the output terminal N2, so that the voltage VN3 and the voltage VN1 may not be similar. Upon sensing an error, the main control circuit 21 may initiate a protection operation to prevent damage to the battery system 1.

Next, the switch control command "open" occurs, the main control circuit 21 determines whether the remainder obtained by dividing the variable i by 2 is 0 (S11). This switch control command "open" may be a switch control command generated after a switch control command "closed" occurs.

Since the variable i became 2 in the diagnosis depending on the previous switch control command "open", the determination result in step S11 is 0. Accordingly, the first charging switch 31 is opened under the control of the main control circuit 21 (S12). Specifically, the main control circuit 21 generates the first charging control signal CHS1 at a disable level to transmit it to the gate driver 33, and the gate driver 33 turns off the switches 311 to 313 by generating the gate voltage VG1 of an off level. Then, the first charging switch 31 is opened.

Then, the variable i is increased by 1 (S13). For example, the variable i becomes 3.

When a predetermined time elapses after the first charging switch 31 is opened, the switch diagnosis unit 23 determines whether the voltage VN3 and the voltage VN2 are similar (S14).

When it is determined in step S14 that the voltage VN2 and the voltage VN3 are similar, the switch diagnosis unit 23 diagnoses the first charging switch 31 as a normal state. Subsequently, the main control circuit 21 controls the second charging switch 32 to open the second charging switch 32 (S15). Specifically, the switch diagnosis unit 23 transmits the determination result, that is, the determination result that the voltage VN2 and the voltage VN3 are similar to the main control circuit 21, the main control circuit 21 generates the second charging control signal CHS2 at a disable level and transmits it to the gate driver 34, and the gate driver 34 turns off the switches 321 to 323 by generating the gate voltage VG2 of an off level. Then, the second charging switch 32 is opened.

When it is determined in step S14 that the voltage VN2 and the voltage VN3 are not similar, the switch diagnosis unit 23 diagnoses the first charging switch 31 as an abnormal state, and depending on a diagnosis result thereof, the main control circuit 21 senses an error of the charging switch unit 30 (S16). When an error occurs in the first charging switch 31, it is not normally opened, and thus the voltage VN3 may be affected by the voltage VN1 of the input terminal N1, so that the voltage VN3 and the voltage VN2 may not be similar. Upon sensing an error, the main control circuit 21 may initiate a protection operation to prevent damage to the battery system 1.

Figure 6:
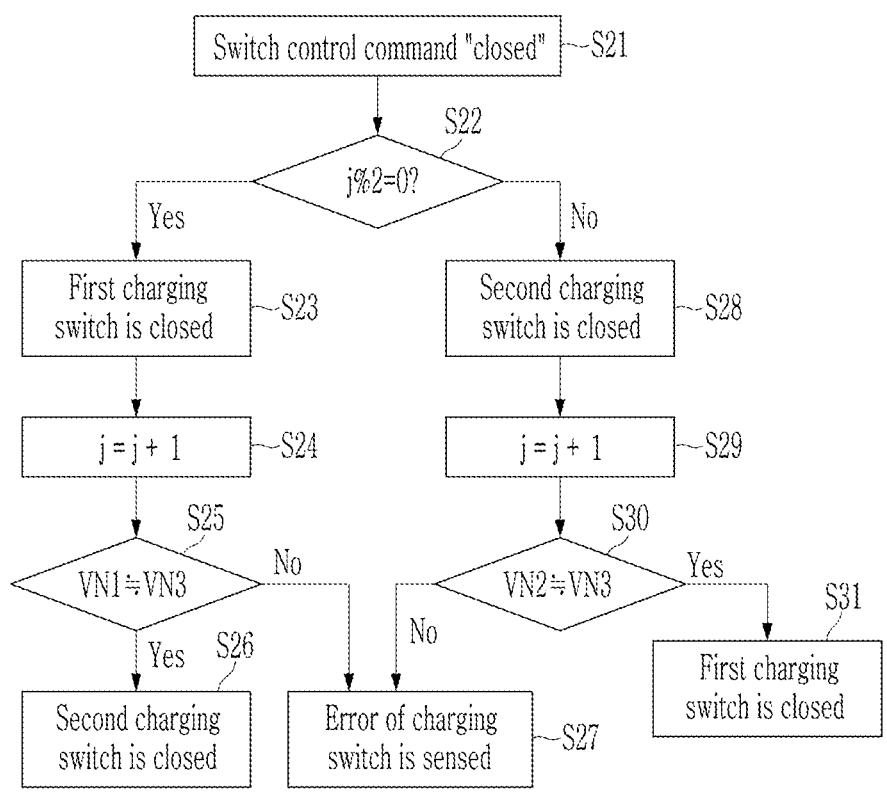
FIG. 6 illustrates a flowchart showing a diagnosis method for sensing an error in a charging switch unit when a switch control command is to close according to an embodiment.

FIG. 6 illustrates a flowchart showing a diagnosis method for sensing an error in a charging switch unit when a switch control command is closed according to an embodiment.

First, a switch control command indicating "closed" is generated (S21).

The main control circuit 21 determines whether the remainder obtained by dividing a variable j by 2 is 0 (S22). The variable j is a variable that is set to first alternately control the first charging switch 31 and the second charging switch 32. It is assumed that an initial value is 1.

Since the determination result of step S22 is not 0, the second charging switch 32 is closed under the control of the main control circuit 21 (S28). Specifically, the main control circuit 21 generates the second charging control signal CHS2 at an enable level to transmit it to the gate driver 34, and the gate driver 34 turns on the switches 321 to 323 by generating the gate voltage VG2 of an on level. Then, the second charging switch 32 is closed.

Then, the variable j is increased by 1 (S29). For example, j becomes 2.

When a predetermined time elapses after the second charging switch 32 is closed, the switch diagnosis unit 23 determines whether the voltage VN3 and the voltage VN2 are similar (S30).

When it is determined in step S30 that the voltage VN2 and the voltage VN3 are similar, the switch diagnosis unit 23 diagnoses the second charging switch 32 as a normal state. Subsequently, the main control circuit 21 controls the first charging switch 31 to close the first charging switch 31 (S31). Specifically, the switch diagnosis unit 23 transmits the determination result, that is, the determination result that the voltage VN2 and the voltage VN3 are similar to the main control circuit 21, the main control circuit 21 generates the first charging control signal CHS1 at an enable level and transmits it to the gate driver 33, and the gate driver 33 turns on the switches 311 to 313 by generating the gate voltage VG1 of an on level. Then, the first charging switch 31 is closed.

When it is determined in step S30 that the voltage VN2 and the voltage VN3 are not similar, the switch diagnosis unit 23 diagnoses the second charging switch 32 as an abnormal state, and depending on a diagnosis result thereof, the main control circuit 21 senses an error of the charging switch unit 30 (S27). When an error occurs in the second charging switch 32, the voltage VN3 and the voltage VN2 may not be similar to each other because the first charging switch 31 is not normally closed. Upon sensing an error, the main control circuit 21 may initiate a protection operation to prevent damage to the battery system 1.

Next, the switch control command "closed" occurs, the main control circuit 21 determines whether the remainder obtained by dividing the variable j by 2 is 0 (S11). This switch control command "closed" may be a switch control command generated after a switch control command "open" occurs.

Since the variable j became 2 in the diagnosis depending on the previous switch control command "closed", the determination result in step S22 is 0. Accordingly, the first charging switch 31 is closed under the control of the main control circuit 21 (S23). Specifically, the main control circuit 21 generates the first charging control signal CHS1 at an enable level to transmit it to the gate driver 33, and the gate driver 33 turns on the switches 311 to 313 by generating the gate voltage VG1 of an on level. Then, the first charging switch 31 is closed.

Then, the variable j is increased by 1 (S13). For example, the variable j becomes 3.

When a predetermined time elapses after the first charging switch 31 is closed, the switch diagnosis unit 23 determines whether the voltage VN3 and the voltage VN1 are similar (S14).

When it is determined in step S25 that the voltage VN1 and the voltage VN3 are similar, the switch diagnosis unit 23 diagnoses the first charging switch 31 as a normal state. Subsequently, the main control circuit 21 controls the second charging switch 32 to close the second charging switch 32 (S26). Specifically, the switch diagnosis unit 23 transmits the determination result, that is, the determination result that the voltage VN1 and the voltage VN3 are similar to the main control circuit 21, the main control circuit 21 generates the second charging control signal CHS2 at an enable level and transmits it to the gate driver 34, and the gate driver 34 turns on the switches 321 to 323 by generating the gate voltage VG2 of an on level. Then, the second charging switch 32 is closed.

When it is determined in step S25 that the voltage VN1 and the voltage VN3 are not similar, the switch diagnosis unit 23 diagnoses the first charging switch 31 as an abnormal state, and depending on a diagnosis result thereof, the main control circuit 21 senses an error of the charging switch unit 30 (S27). When an error occurs in the first charging switch 31, the voltage VN3 and the voltage VN1 may not be similar to each other because the first charging switch 31 is not normally closed. Upon sensing an error, the main control circuit 21 may initiate a protection operation to prevent damage to the battery system 1.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. An error detecting method of a charging switch unit including a first charging switch and a second charging switch connected to a charging line of a battery, the method comprising:
    switching the first charging switch according to a switch control command;
    in response to the first charging switch being switched to open:
        determining whether voltages at opposite ends of the second charging switch are within a predetermined range; and
        determining that the first charging switch is normal in response to the voltages at the opposite ends of the second charging switch being within the predetermined range;
    in response to the first charging switch being switched to closed:
        determining whether the voltages at the opposite ends of the first charging switch are within the predetermined range; and
        determining that the first charging switch is normal in response to the voltages at the opposite ends of the first charging switch being within the predetermined range.

2. The error detecting method of claim 1, further comprising,
    in response to the first charging switch being switched to open and the voltages at the opposite ends of the second charging switches being within the predetermined range, opening the second charging switch.

3. The error detecting method of claim 1, further comprising,
    in response to the first charging switch being switched to closed, and the voltages at the opposite ends of the first charging switch being within the predetermined range, closing the second charging switch.

4. The error detecting method of claim 1, further comprising:
    switching the second charging switch according to the switch control command; and
    in response to the second charging switch being switched to open:
        determining whether the voltages at the opposite ends of the first charging switch are within the predetermined range; and
        determining that the second charging switch is normal in response to the voltages at the opposite ends of the first charging switch being within the predetermined range.

5. The error detecting method of claim 4, further comprising,
    in response to the second charging switch being switched to open, and the voltages at the opposite ends of the first charging switch being within the predetermined range, opening the first charging switch.

6. The error detecting method of claim 1, further comprising:
    switching the second charging switch according to the switch control command; and
    in response to the second charging switch being switched to open:
        determining whether the voltages at the opposite ends of the second charging switch are within the predetermined range; and
        determining that the second charging switch is normal in response to the voltages at the opposite ends of the second charging switch being within the predetermined range.

7. The error detecting method of claim 6, further comprising,
    in response to the second charging switch being switched to closed, and the voltages at the opposite ends of the second charging switch being within the predetermined range, closing the first charging switch.

8. The error detecting method of claim 1, further comprising
    determining which of the first charging switch and the second charging switch to switch according to the switch control command based on the switch control command.

9. A battery system comprising:
    a first charging switch having opposite ends connected to a first terminal of the battery system and an intermediate location of the battery system, respectively;
    a second charging switch having opposite ends connected to the intermediate location and a second terminal of the battery system, respectively; and
    a battery management system configured to:
        in response to a switch control command indicating to open the first charging switch before the second charging switch, determine whether the first charging switch is normal based on a voltage of an intermediate location and a voltage of the second terminal being within a predetermined range; and
        in response to the switch control command indicating to close the first charging switch before the second charging switch, determine whether the first charging switch is normal based on a voltage of the first terminal and the voltage of the intermediate location being within the predetermined range.

10. The battery system of claim 9, wherein the battery management system includes a main control circuit configured to:
    generate a first charging control signal that controls a switching operation of the first charging switch; and generate a second charging control signal that switches the second charging switch in response to the first charging switch being normal.

11. The battery system of claim 10, wherein the main control circuit is configured to:
generate the first charging control signal at a disable level in response to the switch control command indicating to open the first charging switch; and
generate the second charging control signal at the disable level in response to the voltage of the intermediate location and the voltage of the second terminal being within the predetermined range.

12. The battery system of claim 10, wherein the main control circuit is configured to:
generate the first charging control signal at an enable level in response to the switch control command indicating to close the first charging switch; and
generate the second charging control signal at the enable level in response to the voltage of the intermediate location and the voltage of the first terminal being within the predetermined range.

13. The battery system of claim 9, wherein the battery management system is configured to:
in response to a switch control command indicating to open the second charging switch before the first charging switch, determine whether the second charging switch is normal based on the voltage of the intermediate location and a voltage of the first terminal being within the predetermined range; and
in response to the switch control command indicating to close the second charging switch before the first charging switch, determine whether the second charging switch is normal based on the voltage of the second terminal and the voltage of the intermediate location being within the predetermined range.

14. The battery system of claim 13, wherein the battery management system includes a main control circuit configured to:
generate a second charging control signal that controls a switching operation of the second charging switch; and
generate a first charging control signal that switches the first charging switch in response to the second charging switch being normal.

15. The battery system of claim 14, wherein the main control circuit in configured to:
generate the second charging control signal at a disable level in response to the switch control command indicating to open the second charging switch; and
generate the first charging control signal at the disable level in response to the voltage of the intermediate location and the voltage of the first terminal being within the predetermined range.

16. The battery system of claim 14, wherein the main control circuit is configured to:
generate the second charging control signal at an enable level in response to the switch control command indicating to close the first charging switch; and
generate the first charging control signal at the enable level in response to the voltage of the intermediate location and the voltage of the second terminal being within the predetermined range.

* * * * *